United States Patent [19]
Lan et al.

[11] Patent Number: 6,156,611
[45] Date of Patent: Dec. 5, 2000

[54] METHOD OF FABRICATING VERTICAL FET WITH SIDEWALL GATE ELECTRODE

[75] Inventors: Ellen Lan, Chandler; Jenn-Hwa Huang, Gilbert; Kurt Eisenbeiser, Tempe; Yang Wang, Phoenix, all of Ariz.

[73] Assignee: Motorola, Inc., Schaumburg, Ill.

[21] Appl. No.: 09/119,550

[22] Filed: Jul. 20, 1998

[51] Int. Cl.[7] .................................................. H01L 21/336
[52] U.S. Cl. .......................... 438/268; 438/270; 438/576; 438/571; 438/167
[58] Field of Search .................................. 438/268, 270, 438/271, 272, 589, 590, 172, 167, 571, 576, 669

[56] References Cited

U.S. PATENT DOCUMENTS

| | | | |
|---|---|---|---|
| 4,262,296 | 4/1981 | Shealy et al. | 257/267 |
| 4,295,924 | 10/1981 | Garnache et al. | 156/643 |
| 4,568,958 | 2/1986 | Baliga | 257/332 |
| 4,847,214 | 7/1989 | Robb et al. | 437/67 |
| 5,447,874 | 9/1995 | Grivna et al. | 437/40 |
| 5,705,830 | 1/1998 | Siergiej et al. | 257/267 |
| 5,949,124 | 9/1999 | Hadizad et al. | 257/496 |

*Primary Examiner*—Michael Trinh
*Attorney, Agent, or Firm*—A. Kate Huffman

[57] ABSTRACT

A vertical FET is fabricated by etching through a contact layer into a drift layer on a compound semiconductor substrate to form a plurality of mesas, each mesa having an upper surface and each adjacent pair of mesas defining therebetween a trench with sidewalls and a bottom. A conductive layer is conformally deposited over the plurality of mesas and the trenches and anisotropically etched to form contacts on the sidewalls of the trenches and depositing source contacts on the upper surfaces of the mesas and a drain contact on a reverse side of the substrate.

8 Claims, 4 Drawing Sheets

METHOD OF FABRICATING VERTICAL FET WITH SIDEWALL GATE ELECTRODE

FIELD OF THE INVENTION

The present invention pertains to a method of fabricating a high frequency, high power vertical field effect transistor (VFET) and more specifically to methods of fabricating a VFET in a compound semiconductor substrate with an improved gate electrode.

BACKGROUND OF THE INVENTION

An increase in the operation frequency and power density of a semiconductor device requires a decrease in the unit cell dimension of the device. An approach used to reduce gate length and the unit cell size is to orient the current flow in the vertical direction. The vertical field effect transistor (VFET) has several advantages over a standard lateral FET for high frequency, high power applications. The VFET eliminates parasitic capacitance and conductance from the substrate and also provides higher breakdown voltage by passing the current flow in the bulk of the material instead of the device surface. Further, since the ohmic contacts and device channel are aligned vertically, the current density per unit of surface area is much higher than in a lateral FET. This means that for the same surface area VFETs will have much higher power than lateral FETs.

Silicon vertical MOSFETs have been used widely as power devices, and methods of manufacturing have been reported. However, intrinsic material properties of GaAs such as larger bandgap and higher mobility, offers 1.6 times greater breakdown field and 5 to 8 times lower on-resistance compared to Si, which guarantees the superior performance for high frequency, high power operation.

An early GaAs VFET device was a static induction transistor in which adjacent gates were made in V grooves by a diffusion process. The gate-gate spacing was made wide enough such that the channel was never pinched-off and the device was operated in the linear range. See Jun-Ichi Nishizawa, Takeshi Terasaki, and Jiro Shibata, "Field-Effect Transistor Versus Analog Transistor (Sctatic Induction Transistor)", *IEEE Transactions on Electron Devices*, Vol. ED-22, No. 4, April 1975, pp. 185–197.

To effectively pinch-off the channel, an electron beam lithography technique was used to pattern the ohmic contact on the top and a dual angle evaporation was subsequently used to deposit the gate metal. See: U. Mishra, P. A. Maki, J. R. Wendt, W. Schaff, E. Kohn, L. F. Eastman, "Vertical Electron Transistor (VET) in GaAs with a Heterojunction (AlGaAs—GaAs) Cathode", Electronics Letters, Vol. 20, No. 3, February 1984, pp. 145–146; and W. R. Frensley, B. Bayraktaroglu, S. Campbell, H. D. Shih, and R. E. Lehmann, "Design and Fabrication of a GaAs Vertical MESFET", *IEEE Transactions on Electron Devices*, Vol. ED-32, No. 5, May 1985, pp. 952–956. The drawback of this structure is the high manufacturing costs of electron beam lithography, reproducibility problems with the angle evaporation, and the large parasitic gate-drain capacitance. To reduce this capacitance and integrate VFETs into monolithic circuits, an air gap between the gate metal and the semiconductor surface was introduced.

Another method of making VFET devices is to overgrow epitaxial layers on the patterned substrate to form the desired channel spacing and gate doping type. See: U.S. Pat. No. 5,468,661, entitled "Method of making Power VFET Device", issued Jun. 17, 1993 and D. L. Plumton, H. T. Yuan, T. S. Kim, A. H. Taddiken, V. Ley, R. L. Kollman, I. Lagnado, and L. Johnson, "A Low on-Resistance, High-Current GaAs Power VFET", *IEEE Electron Device Letters*, Vol. 16, No. 4, April 1995, pp. 142–144. However, epitaxial regrowth is a complicated, expensive process.

Therefore, it would be highly advantageous to have an improved method of manufacturing GaAs VFETs.

It is a purpose of the present invention to provide a new and improved method of fabricating vertical field effect transistors.

It is another purpose of the present invention to provide a new and improved method of fabricating vertical field effect transistors with lower capacitance and lower ON-resistance.

It is a further purpose of the present invention to provide a new and improved method of fabricating vertical field effect transistors which is less expensive, less time consuming, and simpler than prior methods.

SUMMARY OF THE INVENTION

The above problems and others are at least partially solved and the above purposes and others are realized in a vertical FET which is fabricated by etching through a contact layer into a drift layer on a substrate to form a plurality of mesas. Each mesa has an upper surface and each adjacent pair of mesas define therebetween a trench with sidewalls and a bottom. A conductive layer is conformally deposited over the plurality of mesas and the trenches and anisotropically etched to form contacts on the sidewalls of the trenches. Source contacts are deposited on the upper surfaces of the mesas and a drain contact is deposited on a reverse side of the substrate to complete the vertical FET.

BRIEF DESCRIPTION OF THE DRAWINGS

Referring to the drawings.

DESCRIPTION OF THE PREFERRED EMBODIMENTS

Figure 1:
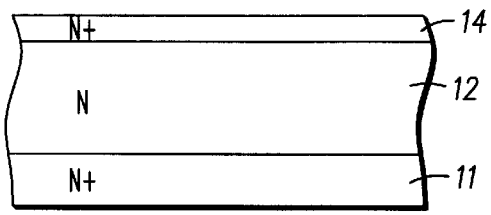
FIG. 1 is a sectional view of a substrate structure.

Turning now to the figures in which like parts are designated with like numbers throughout the specification, FIG. 1 illustrates a substrate structure 10 including a semiconductor substrate 11 with a drift layer 12 formed thereon and a contact layer 14 formed on the upper surface of layer 12. Generally, because this method deals with the fabrication of vertical field effect transistors (VFETs), substrate structure 10 is formed of doped semiconductor material so as to be electrically conductive. In a preferred embodiment, substrate 11 is a relatively heavily doped compound semiconductor material, such as n+ doped gallium arsenide (GaAs). Layer 12 is a lighter doped compound semiconductor material and preferably an epitaxially grown layer of n doped GaAs or an alloy thereof. Layer 14 is a heavily doped compound semiconductor material and preferably an epitaxially grown layer of n+ doped GaAs or an alloy thereof.

Figure 2:
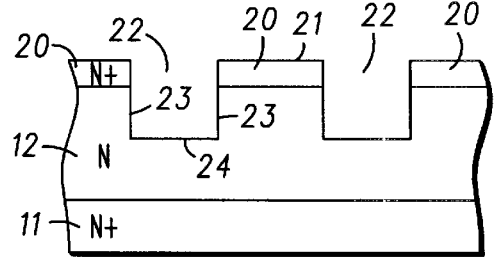
FIG. 2 and FIG. 3 are sectional views of the substrate structure of FIG. 1 after additional steps in a process in accordance with the present invention.

Turning now to FIG. 2, substrate structure 10 is patterned to form a plurality of parallel, spaced apart elongated mesas 20 on or in the upper surface. Each mesa 20 has an upper surface 21 and each adjacent pair of mesas 20 define therebetween a trench 22 with sidewalls 23 and a bottom 24. In a preferred embodiment, the patterning of substrate structure 10 is performed using any standard mask and etch technique, with the etching being accomplished by using directional non-damaging reactive ion etching such as chlorine based anisotropic ECR dry etching. Any photoresist used in the patterning step is stripped and the structure is D.I. water rinsed after completion of the patterning step, and a vacuum baking step is performed to eliminate any residual condensation inside trenches 22.

Figure 3:
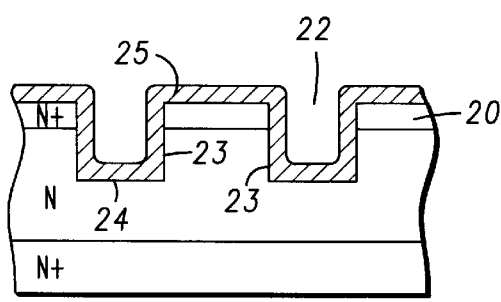
Figure 4:
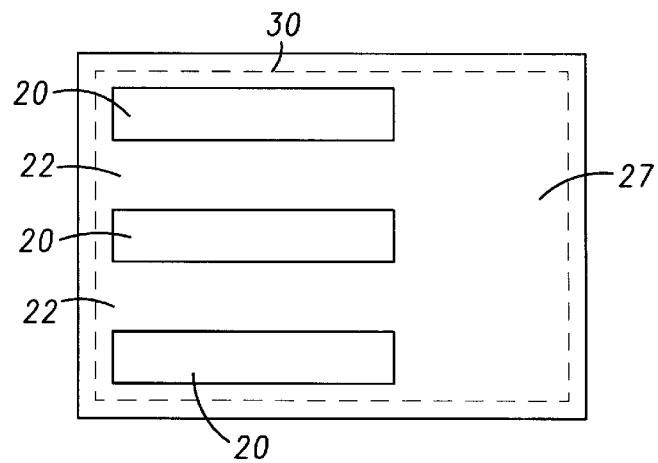
FIGS. 4, 5, and 6, are top plan views of the substrate structure after additional steps in the process.

Turning now to FIG. 3, a conductive material 25 is then conformally deposited over mesas 20 and trenches 22, including sidewalls 23 and bottoms 24. In the preferred embodiment, conductive material 25 is any material suitable for forming Schottky contacts with drift layer 12, such as TiWN or the like. Referring specifically to FIG. 4, a view in top plan of the structure of FIG. 3 is illustrated, including a gate feed region 27 positioned adjacent the ends of mesas 20. Here it should be understood that gate feed region 27 can be an etched area at the same level as bottoms 24 of trenches 22, a mesa-like structure with the upper surface at the same level as surfaces 21 of mesas 20, or any selected convenient level in between. Further, conductive material 25 can be deposited on gate feed region 27 to provide a gate contact, if convenient, or metallization can be performed on gate feed region 27 at some later time, as will be apparent presently.

Figure 5:
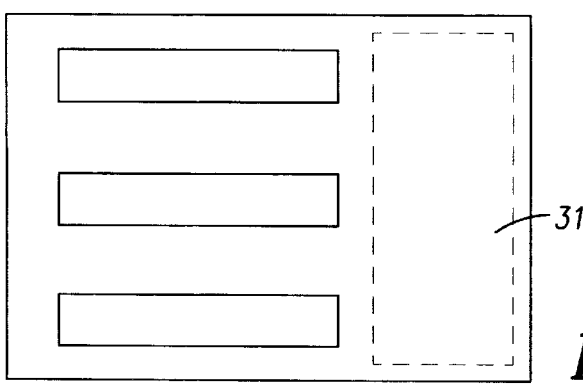
Figure 6:
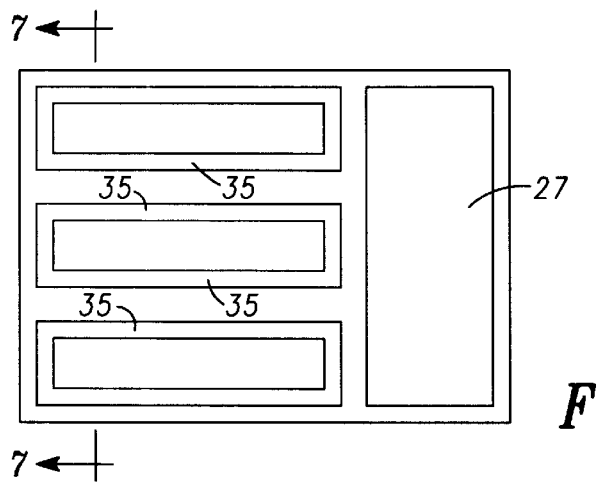
Figure 7:
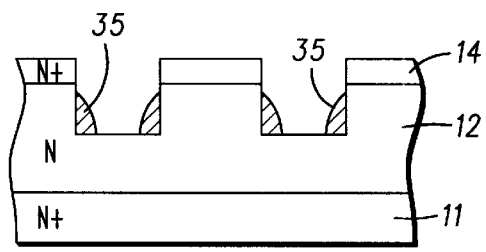
FIG. 7 is a sectional view as seen from the line 7—7 in FIG. 6.
Figure 8:
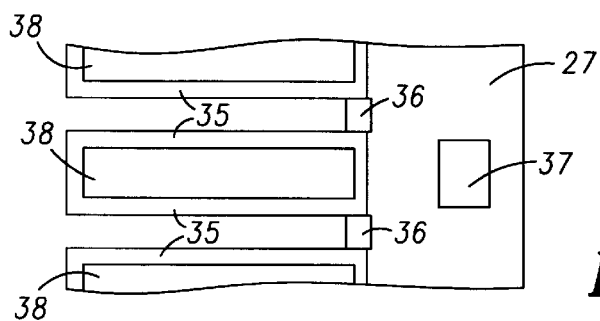
FIG. 8 is a top plan view of a substantially completed structure.

Photoresist is deposited over the structure generally in the region denoted by broken line 30 which includes mesas 20, trenches 22, and gate feed region 27. In this specific embodiment a suitable plasma etch, such as oxygen plasma, is used to etch away the photoresist overlying mesas 20 and trenches 22, leaving a layer 31 of photoresist covering gate feed region 27, as illustrated in FIG. 5. A directional reactive ion etch with good selectivity over photoresist is then used to etch away conductive material 25 on bottoms 24 of trenches 22 and on upper surfaces 21 of mesas 20 while leaving conductive fingers 35 on sidewalls 23 of trenches 22 and in gate feed region 27, as illustrated in FIGS. 6 and 7. A preferrable directional reactive ion etch for this procedure is a fluorine based anisotropic dry etch.

The remaining photoresist is then removed. Conductive material is deposited at areas 36 to connect conductive fingers 35 to conductive material in gate feed region 27, if present, or to deposit conductive material in gate feed region 27 if not present from a previous step. A gate contact 37 is deposited in gate feed region 27 to provide an external connection to all of conductive fingers 35. Also, source contacts 38 are deposited on the upper surfaces 21 of mesas 20 and a drain contact is deposited on the reverse surface of substrate 11. In a preferred embodiment, the gate contact 37 and the source and drain contacts are all ohmic contacts with source contacts 38 being shallow penetration ohmic contacts to avoid the enhanced alloying/diffusion due to more surface area created by trenches 22 around mesas 20.

Figure 9:
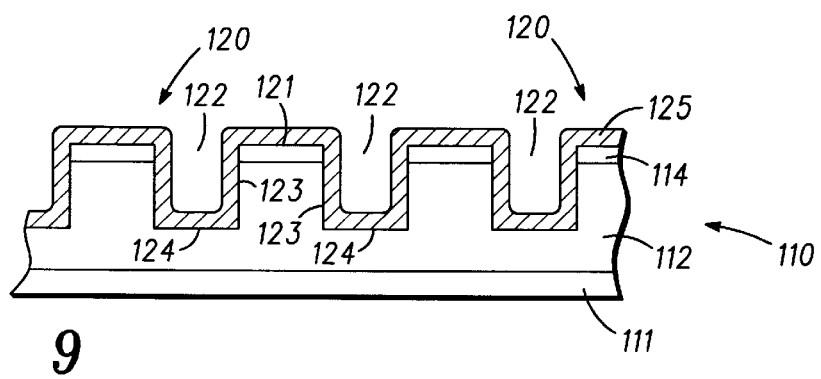
FIGS. 9–13 are a sequence of sectional views illustrating various steps in another embodiment beginning with the structure of FIG. 3.

Turning now to FIGS. 9 through 13 and referring specifically to FIG. 9, a substrate structure 110 is illustrated which is similar to substrate structure 10 of FIG. 1 (including substrate 111 and layers 112 and 114). Also, substrate structure 110 is patterned, as explained in conjunction with FIG. 2, to form a plurality of elongated parallel spaced apart mesas 120, each having an upper surface 121 and each adjacent pair of mesas 120 defining therebetween a trench 122 with sidewalls 123 and a bottom 124. Further, a uniform layer of conductive material 125 is deposited over mesas 120 and trenches 122, including sidewalls 123 and bottoms 124.

Figure 10:
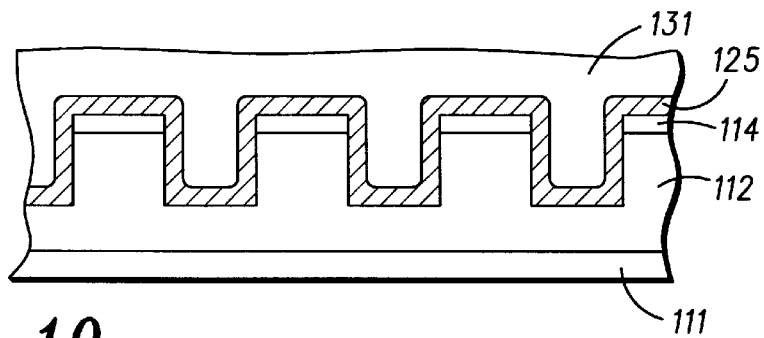
Figure 11:
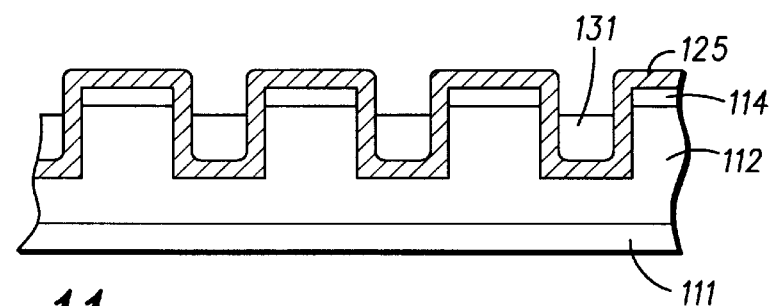
Figure 12:
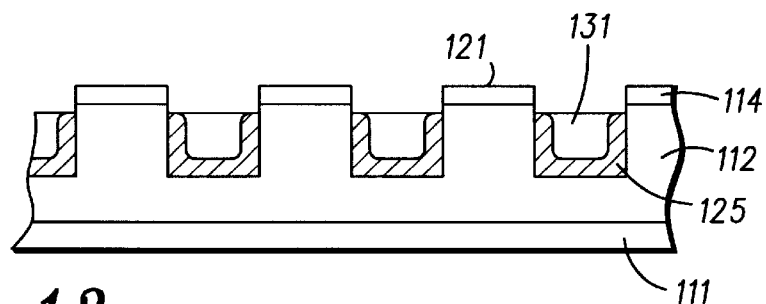

Referring specifically to FIG. 10, a layer 131 of photoresist is formed over the structure and a reactive ion etch is used to uniformly etch away a portion of the thickness of layer 131, reducing the thickness so as to expose conductive material 125 on upper surfaces 121 of mesas 120 and a portion of sidewalls 123, generally below layer 114, as illustrated in FIG. 11. The etching of layer 131 of photoresist is preferably performed using oxygen based isotropic dry etching. A directional reactive ion etch with good selectivity over photoresist is then used to etch away the exposed conductive material 125 leaving bottoms 124 and portions of sidewalls 123 in each trench 122 covered with conductive material 125 which serves as a gate contact.

Figure 13:
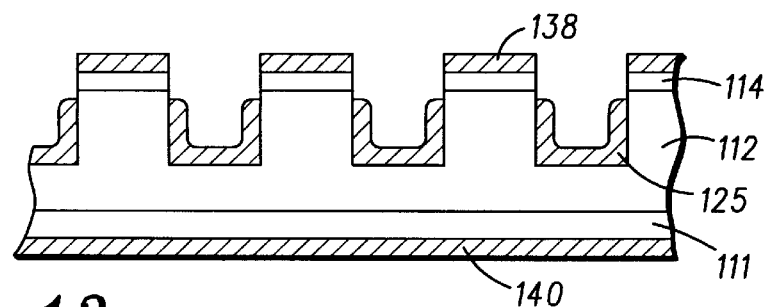

The remaining portions of layer 131 of photoresist are then removed by any convenient process, as illustrated in FIG. 13. Ohmic contacts 138 are deposited on upper surfaces 121 of each mesa 120 to form source contacts and a drain contact is formed by depositing a layer 140 of conductive material on the reverse side of substrate 111. All of the gate contacts in individual trenches 122 can then be connected to a common externally accessible gate contact (not shown) by some method, such as that described above.

Figure 14:
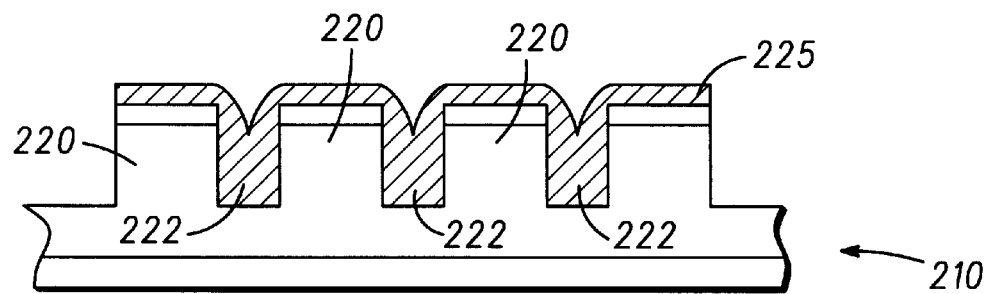
FIGS. 14 and 15 are a sequence of sectional views illustrating various steps in another embodiment of the present invention.
Figure 15:
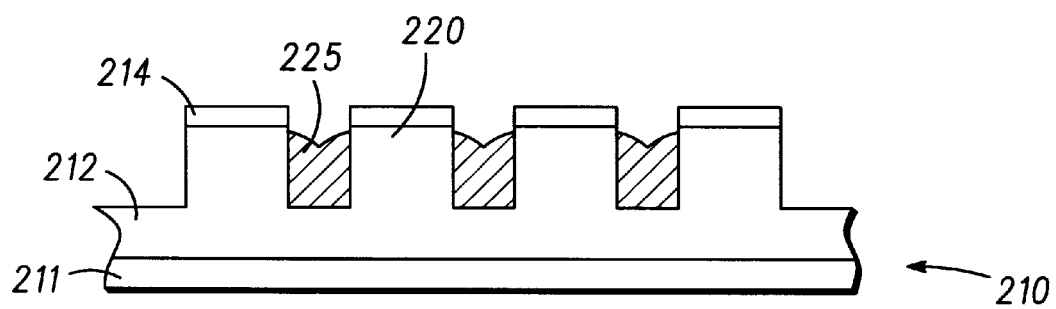

Referring to FIGS. 14 and 15, a somewhat different embodiment is illustrated in which a substrate structure 210 is illustrated which is similar to substrate structure 10 of FIG. 1 (including substrate 211 and layers 212 and 214). Also, substrate structure 210 is patterned, as explained in conjunction with FIG. 2, to form a plurality of elongated parallel spaced apart mesas 220, each having an upper surface 221 and each adjacent pair of mesas 220 defining therebetween a trench 222 with sidewalls 223 and a bottom 224. Further, a uniform layer of conductive material 225 is deposited over mesas 220 and trenches 222, including sidewalls 223 and bottoms 224. In this embodiment, trenches 222 are formed thin enough so that conductive material 225 substantially fills trenches 222 and, thus, masking of layer 225 is not required (see FIGS. 10 and 11 for an example of masking).

A directional reactive ion etch is then used to uniformly etch away portions of conductive material 225 leaving each trench 222 substantially filled with conductive material 225 which serves as a gate contact. Again, conductive material 225 is etched to a. point below contact layer 214 so as not to short the sources to the gates.

Thus, a new and improved method of fabricating vertical field effect transistors is disclosed which results in VFETs with lower capacitance and lower ON-resistance. Further, the new and improved method is less expensive, less time consuming, and simpler than prior methods. Also, the new method provides new and improved VFETs which can be conveniently fabricated in compound semiconductor materials, such as GaAs or the like and which result in high frequency, high power VFETs.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating a vertical FET with sidewall gate electrode comprising the steps of:

providing a doped semiconductor substrate with a semiconductor drift layer formed thereon and a semiconductor contact layer formed on the semiconductor drift layer;

etching through the semiconductor contact layer into the semiconductor drift layer to form a plurality of parallel, spaced apart elongated mesas, each mesa having an end and an upper surface and each adjacent pair of mesas defining therebetween an elongated trench with substantially vertical sidewalls and a bottom, and defining a gate feed region adjacent the ends of the mesas;

conformally depositing a conductive layer over the plurality of mesas and the trenches, including the sidewalls and the bottoms of the trenches;

depositing a layer of resist over the conductive layer;

removing a portion of the resist to expose portions of the conductive layer on the upper surface of the mesas and the sidewalls and the bottoms of the trenches;

anisotropically etching the conductive layer to remove the exposed portions of the conductive layer on the upper surface of the mesas and the bottoms of the trenches so as to leave portions of the conductive layer on the sidewalls of the trenches;

removing remaining portions of the resist in the gate feed region;

depositing conductive material on the upper surfaces of the mesas and in the gate feed region, and depositing conductive material to connect the portions of the conductive layer on the sidewalls of the trenches to portions of the conductive material in the gate feed region; and depositing conductive material on a reverse side of the substrate.

2. A method of fabricating a vertical FET with sidewall gate electrode as claimed in claim 1 wherein the step of providing the doped semiconductor substrate with the semiconductor drift layer formed thereon and the semiconductor contact layer formed on the semiconductor drift layer includes epitaxially growing the semiconductor drift layer on the substrate and epitaxially growing the semiconductor contact layer on the semiconductor drift layer.

3. A method of fabricating a vertical FET with sidewall gate electrode as claimed in claim 2 wherein the step of providing the semiconductor doped substrate with the semiconductor drift layer formed thereon and the semiconductor contact layer formed on the semiconductor drift layer includes providing a n+ doped semiconductor substrate, a n doped semiconductor drift layer, and a n+ doped semiconductor contact layer.

4. A method of fabricating a vertical FET with sidewall gate electrode as claimed in claim 1 wherein the step of etching through the semiconductor contact layer into the semiconductor drift layer to form the plurality of mesas includes forming a resist pattern on the semiconductor contact layer and etching with a directional reactive ion etch.

5. A method of fabricating a vertical FET with sidewall gate electrode as claimed in claim 1 wherein the step of conformally depositing the conductive layer includes depositing conductive material for forming Schottky contacts with the drift layer.

6. A method of fabricating a vertical FET with sidewall gate electrode as claimed in claim 5 wherein the step of conformally depositing conductive material for forming Schottky contacts with the drift layer includes conformally depositing TiWN.

7. A method of fabricating a vertical FET with sidewall gate electrode as claimed in claim 5 wherein the step of removing a portion of the resist includes performing a reactive ion etch.

8. A method of fabricating a vertical FET with a sidewall gate electrode as claimed in claim 1 wherein the step of providing the substrate includes providing a compound semiconductor substrate.

* * * * *